United States Patent [19]
Ando et al.

[11] Patent Number: 5,850,688
[45] Date of Patent: Dec. 22, 1998

[54] METHOD OF MANUFACTURING ELECTRONIC COMPONENT

[75] Inventors: Daizo Ando, Katano; Tadashi Nakamura, Hirakata; Shinji Umeda, Neyagawa; Kunihiko Oishi, Hirakata, all of Japan

[73] Assignee: Matsushita Electric Industrial Co., Ltd., Osaka, Japan

[21] Appl. No.: 820,546

[22] Filed: Mar. 19, 1997

Related U.S. Application Data

[62] Division of Ser. No. 381,655, Jan. 31, 1995, Pat. No. 5,644,478.

[30] Foreign Application Priority Data

Jan. 31, 1994 [JP] Japan ..................... 6-009202

[51] Int. Cl.⁶ ........................................ H05K 3/30
[52] U.S. Cl. ..................... 29/832; 29/840; 156/89; 257/827; 257/848; 257/700
[58] Field of Search .................... 257/664, 700, 257/848, 827; 156/89; 29/832, 840

[56] References Cited

U.S. PATENT DOCUMENTS

| | | |
|---|---|---|
| 4,639,632 | 1/1987 | Nakata et al. . |
| 5,448,826 | 9/1995 | Goetz et al. . |
| 5,465,008 | 11/1995 | Goetz et al. . |
| 5,545,849 | 8/1996 | Kondo . |

*Primary Examiner*—Carl J. Arbee
*Attorney, Agent, or Firm*—McDermott, Will & Emery

[57] ABSTRACT

An electronic element which is free of many of the impurities that tend to adversely affect its operation. The electronic element is hermetically sealed in a space formed by a framework having a first and second plate directly joined to its sides. Directly joining the first and second plates to the framework prevents splashes of adhesive and soldering material from effecting the operation of the electronic element.

15 Claims, 9 Drawing Sheets

HEATING

METHOD OF MANUFACTURING ELECTRONIC COMPONENT

This is a divisional of application Ser. No. 08/381,655, filed Jan. 31, 1995, now U.S. Pat. No. 5,644,478.

BACKGROUND OF THE INVENTION

This invention relates to an electronic component and its manufacturing method.

An electronic element such as a SAW filter, a SAW oscillator, a quartz vibrator or the like, for example, usually employs a structure wherein the corresponding electronic element is hermetically sealed in a container to prevent the characteristics thereof from being changed by the ambient conditions.

Since it was a usual practice with the foregoing structures of the prior art electronic components to use an adhesive and soldering material for fixing a cover for the purpose of hermetically sealing the container and also mounting the electronic element itself, the adhesive and soldering material employed tended to affect the characteristics of the electronic element adversely.

More specifically, part of the adhesive and soldering material is splashed and attached on the electronic element causing the characteristics thereof to change.

SUMMARY OF THE INVENTION

The object of the present invention is to provide an electronic component, which is free of impurities such as adhesive and soldering material attached thereon, thereby its characteristics are prevented from changing. Another object is to provide a manufacturing method for such an electronic component.

For achieving the foregoing object, the electronic component of the present invention comprises:
- a framework with its first side and second side left uncovered;
- an electronic element mounted inside of the framework, and provided with electrodes;
- a first plate directly fixed onto the foregoing first side of the framework, and provided with feedthrough holes;
- a second plate directly fixed onto the foregoing second side of the framework;
- conductors disposed inside of the foregoing feedthrough holes by hermetical sealing, and connected to the foregoing electrodes; and
- external electrodes disposed on the outside surface of the foregoing first plate, and connected to the foregoing conductors.

The manufacturing method for the electronic component of the present invention comprises the steps of:
(a) producing a framework with its first side and second side left uncovered by processing a base material on its first side and also its second side;
(b) fixing a first plate on the first uncovered side of the foregoing framework;
(c) mounting an electronic element inside of the foregoing framework;
(d) fixing a second plate on the second uncovered side of the foregoing framework; and
(e) performing a direct joining between the foregoing framework and first plate and also between the foregoing framework and second plate by heating the whole assembly obtained in the preceding steps.

Thus, the electronic element is hermetically sealed in a space formed by the framework, first plate and second plate.

In this case, since the first plate and second plate are directly joined to the first side and second side of the framework, respectively, the characteristics changes that have been experienced with the prior art electronic element due to splashes of an adhesive and soldering material do not take place.

Also, according to the foregoing manufacturing method, the first uncovered side and second uncovered side of the framework are formed by a processing applied to the base material separately, and no cracking or breakage of the framework occurs on the surfaces thereof, where the framework comes into a direct contact with the first plate or the second plate.

As a result, the direct joining between the framework and the first plate as well as the framework and the second plate is securely performed.

More specifically, in case where the opening on the framework is formed by scraping from only the first side, burrs are created at the edges without fail, and the burrs are flown (i.e., filled to excess) at the time of fixing the first or second plate to fill in the gaps between the framework and first plate, and also between the framework and second plate to interfere with the direct joining between the respective bodies. In order to prevent creation of such burrs, the openings in the framework are formed by a machining process applied separately to the first side and second side of the framework.

DETAILED DESCRIPTION OF THE INVENTION

A detailed description will be made of the present invention with the help of examples.

EXAMPLE 1

Figure 1:
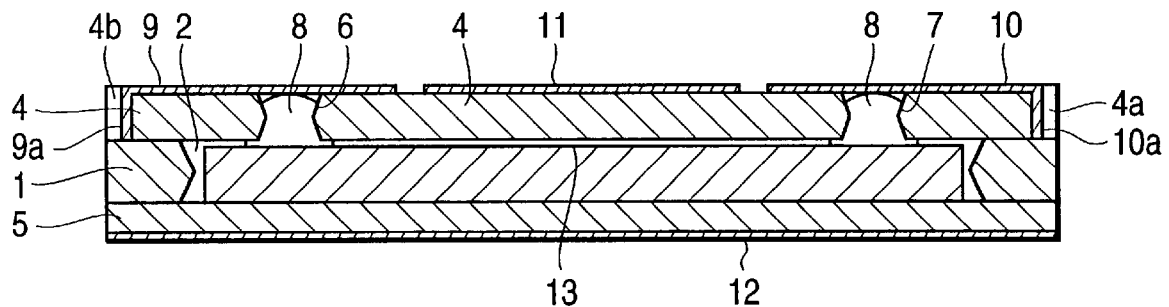
FIG. 1 is a cross-sectional view showing important structures of an electronic component as an exemplary embodiment of the present invention.
Figure 2:
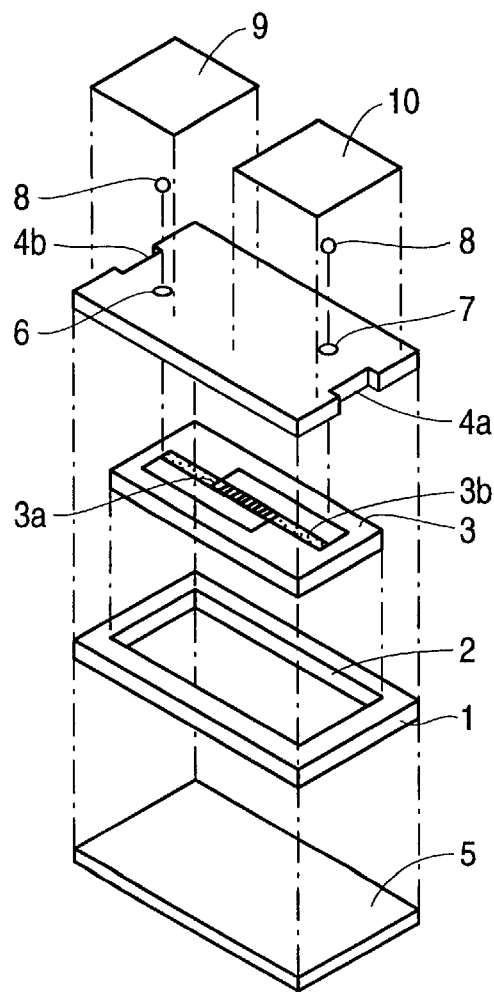
FIG. 2 is an exploded perspective view of an electronic component as an exemplary embodiment of the present invention.
Figure 3A:
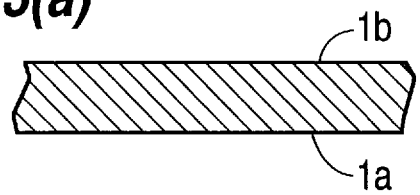
FIGS. 3(A)–(D) are a series of cross-sectional views showing a manufacturing process of a framework and a process of joining the framework with a first plate as an exemplary embodiment of the manufacturing method for an electronic component of the present invention.
Figure 3B:
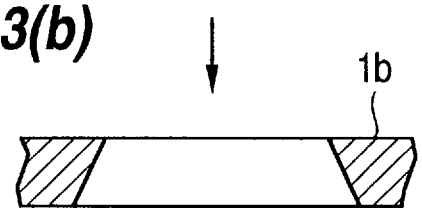
Figure 3C:
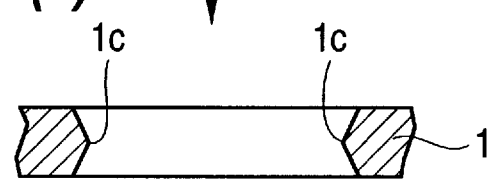
Figure 3D:
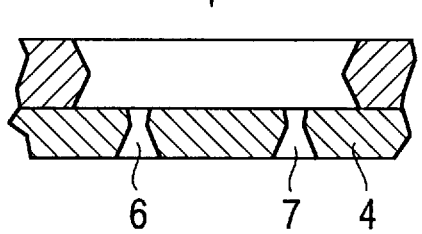

FIG. 1 is a cross-sectional view of an electronic component as an example of the present invention, and FIG. 2 is a perspective view showing how the elements of the electronic component are assembled.

In FIG. 1 and FIG. 2, a framework 1 is made of electrically insulating borosilicate glass, for example. Inside of an opening space 2 of the framework 1 is contained a SAW oscillator 3 as an electronic element, for example.

A first plate 4 and second plate 5, both made of borosilicate glass, are directly joined to a first side opening plane and second side opening plane of the framework 1, respectively, each of which is situated on the respective side of the framework 1 and facing each other. Also, two feedthrough holes 6 and 7 are made in the first plate 4, and a conductor 8 is disposed inside of the feedthrough holes 6 and 7 and sealed hermetically.

One end of the conductor 8 is respectively connected to electrodes 3a and 3b formed on the SAW oscillator 3, and the other end is connected to external electrodes 9 and 10 formed on the outside surface of the first plate 4.

The framework 1 measures, for example, 2 mm wide and 4 mm long on the outside, and 1.4 mm wide and 3.2 mm long on the inside. The SAW oscillator 3 measures, for example, 1.3 mm wide and 3.1 mm long. The diameter of the feedthrough holes is, for example, 0.3 mm.

In the preferred embodiment, the framework 1 measures 400 $\mu$m thick, the first plate 4 measures 300 $\mu$m thick, the second plate 5 measures 200 $\mu$m thick and the SAW oscillator 3 measures 380 $\mu$m thick. Since the SAW oscillator 3 is thinner than the framework 1, there is a space 13 formed without fail between the first side opening plane of the framework 1 and the inside surface of the first plate 4 as shown in FIG. 1. Therefore, the oscillation of the SAW oscillator 3 cannot be impeded at all. Further, the conductor 8 is connected through this space 13 to the electrodes 3a and 3b. Although the SAW oscillator 3 is pressed towards the second plate 5 only by the conductor 8 at two places, any displacement of the SAW oscillator 3 in any directions, to and fro or right and left, on the second plate 5 does not occur.

Accordingly, the SAW oscillator 3 can be hermetically sealed in the space formed by the framework 1, the first plate 4 and the second plate 5. In this case, the first plate 4 and second plate 5 are directly joined to the first side and second side of the framework 1, respectively, and any changes in the electronic element's characteristics due to splashes of an adhesive and soldering material as occurred with the prior art devices cannot be observed.

Since the opening space 2 in the framework 1 is made by a machining process applied from both the first side opening plane and second side opening plane, it is possible, as shown in FIG. 1, to make the approximate middle point, where the first side opening plane and second side opening plane of the framework 1 meet, stick out towards the SAW oscillator 3.

The magnitude of the foregoing protrusion is not specifically defined, but it may extend as much as 100 $\mu$m, for example. Accordingly, there will not be any burrs created by the machining process on the upper and lower edges of the opening space 2 in the framework 1. Therefore, the burrs are not falling between the framework 1 and the plates 4 and 5, thereby enabling the first side opening plane of the framework 1 and first plate 4, and the second side opening plane of the framework 1 and second plate 5 to join together perfectly.

In FIG. 1, it is possible to dispose shielding electrodes 11 and 12 at a specified place on the outside surface or the inside surface of the first plate 4 and second plate 5, respectively, for the purpose of electromagnetic shielding.

It is also possible to have recessed places 4a and 4b formed on both ends of the first plate 4, which are located apart from each other along the length thereof, and also to have end surface electrodes 9a and 10a, which form extensions of the external electrodes 9 and 10, respectively, disposed on the foregoing recessed places 4a and 4b.

The electronic component of the present invention thus completed will be mounted on a printed wiring board by way of the external electrodes 9 and 10, or the end surface electrodes 9a and 10a disposed on the recessed places 4a and 4b.

EXAMPLE 2

In connection with the manufacturing method for an electronic component of the present invention, the case where a SAW oscillator is used as an electronic element of the electronic component will be explained.

FIGS. 3(A)–(D) through FIG. 12 are cross-sectional views to explain important portions of the manufacturing method for an electronic component as an exemplary embodiment of the present invention, and the reference numerals used in the foregoing figures are the same as those referred to in FIG. 1 and FIG. 2 used in explaining Example 1.

With the present example, a plurality of identical electronic components are first fabricated on a wafer at a time so that all the electronic components are arranged orderly on the wafer surface lengthwise as well as breadthwise, and then the wafer is broken up into individual pieces of the electronic component. FIG. 3 through FIG. 12 deal with important portions of only one electronic component out of many formed on the wafer material.

EXAMPLE 2A

First, the manufacturing method for a framework and the fixing process to put the framework together with plates will be explained with the help of FIGS. 3(A)–(D).

A mirror surfaced plate of a base material made of glass is processed from its first side plane 1a. Then, the base material is processed from its second side plane 1b to complete a framework 1 of specified configurations. As the foregoing processing means may be used, for example, sand blasting, scrapping and the like. At this time, the processing is performed so that the approximate middle point, where the first side plane 1a and second side plane 1b of the framework 1 meet each other, is made to stick out towards the inside of the framework 1. As a result, there will not be any burrs created on the upper and lower edges of the opening space in the framework On the other hand, two feedthrough holes 6 and 7 are formed on a first plate 4 at specified positions thereof. The diameter of each respective feedthrough hole 6 and 7 varies from place to place along its length such that the diameter is smallest at the middle point of the hole's entire length and increases towards both surfaces.

Next, the first plate 4 having the two feedthrough holes 6 and 7 is fixed on the framework 1 to cover the first opening plane 1a. At this time, the surfaces, where the framework 1 and first plate 4 are put together, are mirror finished.

With the present example, it is also possible to make the configuration of the feedthrough holes 6 and 7 to have each respective diameter thereof reduced towards the surface where the SAW oscillator 3 is mounted.

EXAMPLE 2B

Figure 4A:
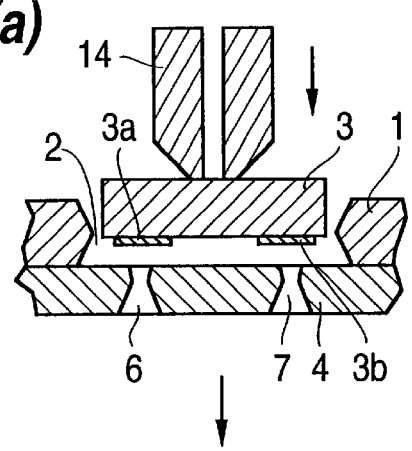
FIGS. 4(A)–(C) are a series of cross-sectional views showing an electronic element mounting process and a process of joining a framework with a second plate as an exemplary embodiment of the manufacturing method for an electronic component of the present invention.
Figure 4B:
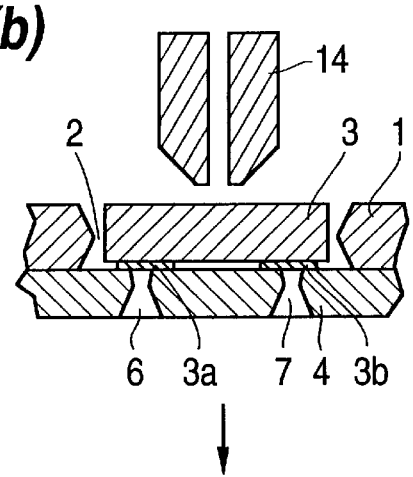

A mounting process of the SAW oscillator will be explained with the help of FIGS. 4(A)–(C). The processes hereafter are preformed in a dry nitrogen gas atmosphere.

With the foregoing example 2A, the inside of the opening space 2 is depressurized by evacuating through the feedthrough holes 6 and 7. Under this condition, the SAW oscillator 3 having two electrodes 3a and 3b is held by sucking on its back side surface by means of a sucking jig 14, and lowered in position as illustrated in FIG. 4(A). When the SAW oscillator 3 is lowered in position halfway in the opening space 2, the lowering of the sucking jig 14 is stopped there and, at the same time, the sucking is ceased. Then, the SAW oscillator 3 is separated from the sucking jig 14 due to the depressurization of the opening space 2 provided through the feedthrough holes 6 and 7, and falls on the first plate 4 as shown in FIG. 4(B). Since the foregoing fall of the SAW oscillator 3 extends over only a distance of 100 μm, there will not be any damages inflicted on the SAW oscillator 3. The positions of the electrodes 3a and 3b of the SAW oscillator 3 match exactly with those of the feedthrough holes 6 and 7 exposed in the opening space 2, respectively. The two feedthrough holes 6 and 7 and two electrodes 3a and 3b are designed to be formed at positions opposite with each other, respectively.

Figure 4C:
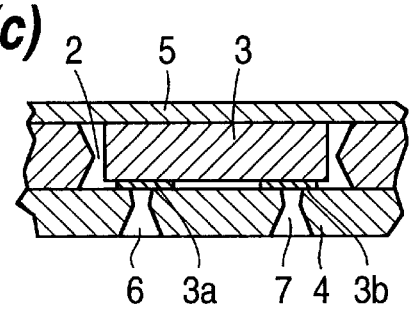
Figure 4C:
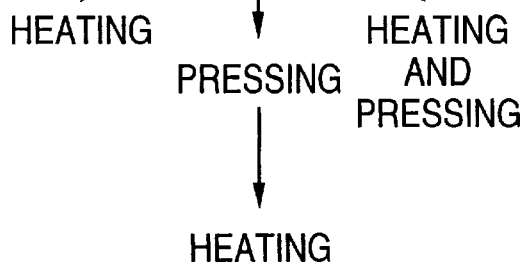

Under this state, the second plate 5 is fixed on the second side opening plane of the framework 1 as illustrated in FIG. 4(C). In order to assemble these together, the areas of the joining surfaces of the framework 1, first plate 4 and second plate 5, where these are put together, have to be kept mirror finished.

Then, the entire assembly comprised of the framework 1, first plate 4, second plate 5 and SAW oscillator 3 is heated at 300° C. for 5 minutes. As a result, the framework 1 and first plate 4, and the framework 1 and second plate 5 are directly joined together on each respective joining surface in a perfect manner.

Alternatively, it is possible first to press together the framework 1 and first plate 4, and the framework 1 and second plate 5, and then heat the resultant assembly. It is also possible, instead of employing a heating process, to press together and simultaneously heat the framework 1 and first plate 4, and the framework 1 and second plate 5. Thus, by applying pressure in addition to heating, joining between the framework 1 and both the plates 4 and 5 is performed more securely and effectively.

More specifically, an application of a pressure to a joining surface results in secure and direct connection between two surfaces even when a small amount of dust or the like exists on the joining surface because the areas surrounding the dust or the like are strongly pressed and joined together.

EXAMPLE 2C

Figure 5A:
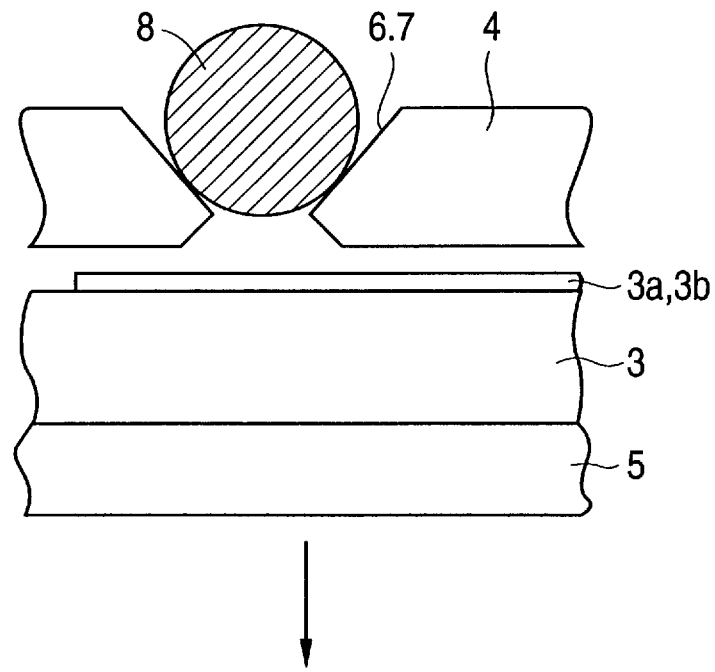
FIGS. 5(A)–(B) show cross-sectional views of processes of conductor insertion as an exemplary embodiment of the manufacturing method for an electronic component of the present invention.

Next, an insertion process of a conductor 8 will be explained with the help of FIGS. 5(A)–(B). After the framework 1 and first plate 4, and the framework 1 and second plate 5 have been put together, respectively, as explained in the foregoing example, the assembly is turned upside down as shown in FIG. 5(A), and a spherical conductor 8 is placed in each of the feedthrough holes 6 and 7.

Since the configuration of the feedthrough holes 6 and 7 is formed such that the diameter of each hole becomes larger towards both the upper and lower surfaces from a boundary line which is situated a little towards the bottom from the midpoint, and also the opening diameter on the outer surface of the first plate 4 is made larger than that on the inner surface thereof, the spherical conductor 8 rolls into each of the feedthrough holes 6 and 7 smoothly.

Figure 5B:
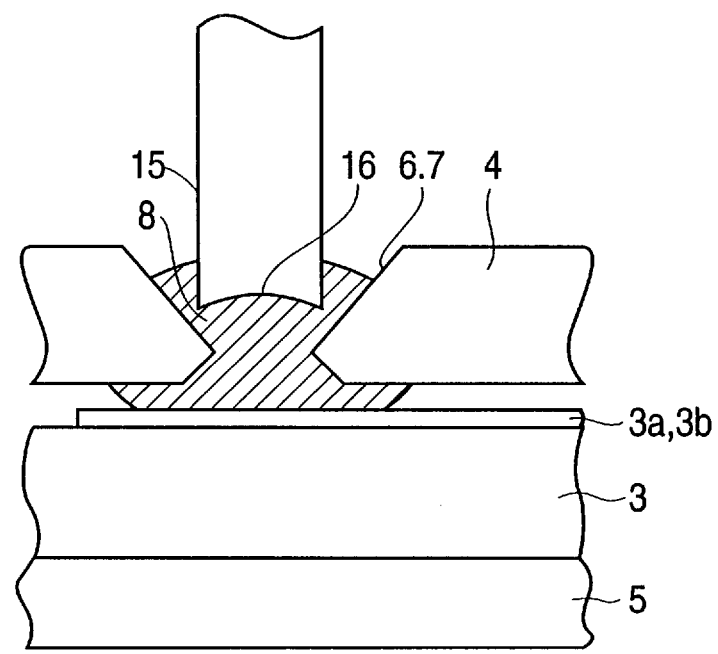

Under this state, an ultrasonic joining head 15 is pressed on the conductor 8 as shown in FIG. 5(B). When ultrasonic vibrations are applied to the ultrasonic joining head 15, the spherical conductor 8 is softened thereby sealing the inside of each of the feedthrough holes 6 and 7. At the same time, electrical connections between the conductor 8 and the electrodes 3a and 3b formed on the SAW oscillator 3 are securely performed.

As the conductor 8 is preferred to be a solder coated with at least one metal of oxygen affinity selected from Zn, Sb, Al, Ti, Si, Cu and Cd, for example. Accordingly, the metal of oxygen affinity is coupled with oxygen atoms existing on the inner surfaces of the feedthrough holes 6 and 7 of the first plate 4, and then further coupled with the solder. As a result, the feedthrough holes 6 and 7 are perfectly sealed by the conductor 8.

The same effect as above can also be obtained by mixing the solder with the foregoing metals of oxygen affinity.

Besides, the tip of the ultrasonic joining head 15 is preferred to be concaved as indicated by 16 in FIG. 5(B). This concaved curvature helps the conductor 8 be pressed downwards along the feedthrough holes 6 and 7 smoothly, resulting in prevention of the conductor 8 from flowing out of the feedthrough holes 6 and 7.

When the feedthrough holes 6 and 7 are hermetically sealed by the conductor 8, a dry nitrogen gas can be filled in the space enclosed by the first plate 4, second plate 5 and framework 1 with a resulting effect of preventing the foregoing enclosed space from suffering a moisture condensation encountered under a low temperature operation.

Figure 6:
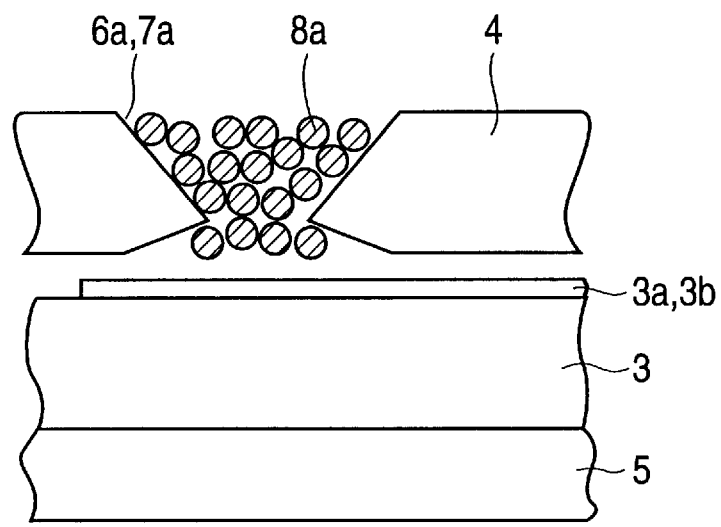
FIG. 6 is a cross-sectional view showing an insertion process of conductors as another exemplary embodiment of the manufacturing method for an electronic component of the present invention.

It is further possible to make the configuration of the feedthrough holes 6a and 7a such that the diameter thereof increases from the mid-point of the feedthrough holes towards the surfaces of the plate 4 as illustrated in FIG. 6. Also, as shown in FIG. 7, the configuration of the feedthrough holes 6b and 7b can be formed so that the diameter thereof is smaller at the side of SAW oscillator 3 than that at the opposite side.

Figure 7:
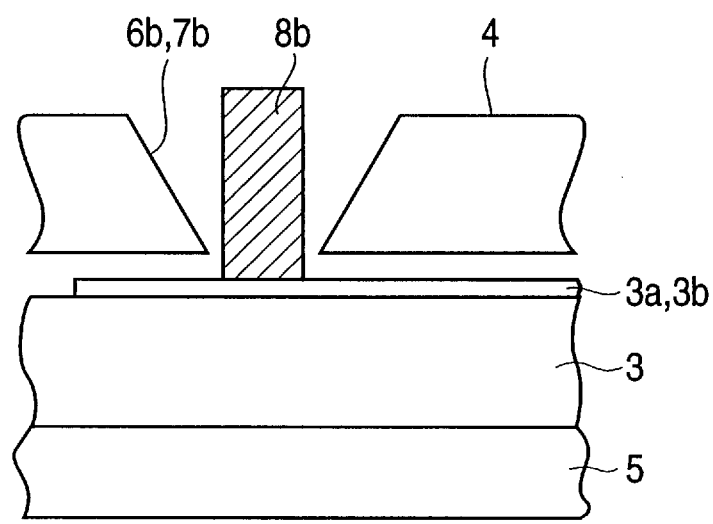
FIG. 7 is a cross-sectional view showing an insertion process of a conductor as still another exemplary embodiment of the manufacturing method for an electronic component of the present invention.

In place of a spherical conductor 8, a pulverized or granular conductor 8a as shown in FIG. 6, or a linear or columnar conductor 8b as shown in FIG. 7 can also be used.

EXAMPLE 2D

Another exemplary embodiment of the present invention in connection with the insertion process of the conductor 8 will be explained with the help of FIGS. 8(A)–(E). With the present example, a SAW oscillator is mounted after a conductor has been inserted into a feedthrough hole of a first plate.

Figure 8A:
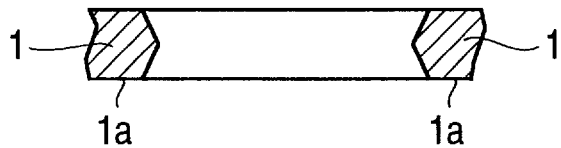
FIGS. 8(A)–(E) are a series of cross-sectional views showing another exemplary embodiment of the manufacturing method for an electronic component of the present invention.
Figure 8B:
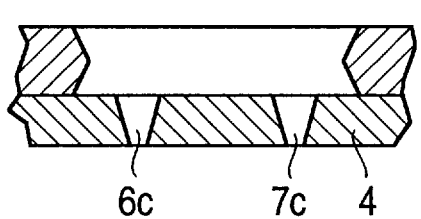
Figure 8C:
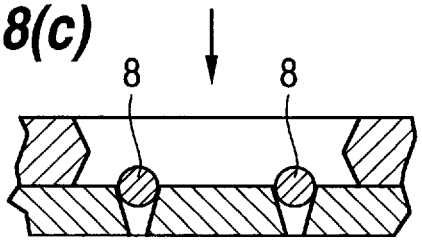
Figure 8D:
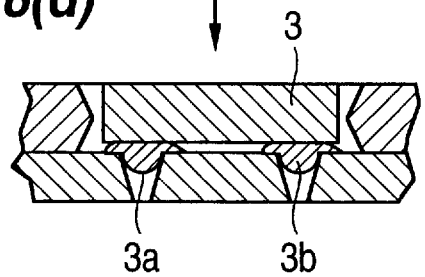
Figure 8E:
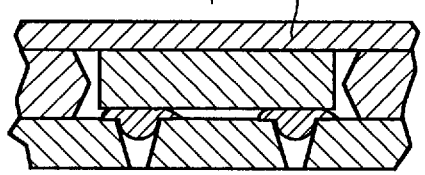

As shown in FIGS. 8(A)–(B), a first plate 4, which has two feedthrough holes 6c and 7c, is first made to adhere to the first side opening plane la of the framework 1. Each of the two feedthrough holes 6c and 7c has a larger diameter at the side where a SAW oscillator 3 is mounted than the diameter at the opposite side. A spherical conductor 8 is made to roll into each of the feedthrough holes 6c and 7c from the side having a larger diameter as shown in FIG. 8(C). Then, the SAW oscillator 3 is placed and fixed inside of the framework 1 so that the electrodes 3a and 3b formed on the SAW oscillator 3 are made to attach to each of the conductor 8 as shown in FIG. 8(D). A second plate 5 is then disposed on the second side opening plane of the framework as shown in FIG. 8(E).

Subsequently, the whole assembly is heated to 300° C. to complete integration through joining the framework 1 directly to the first plate 4 and second plate 5 at the respective contacting surfaces.

Figure 9:
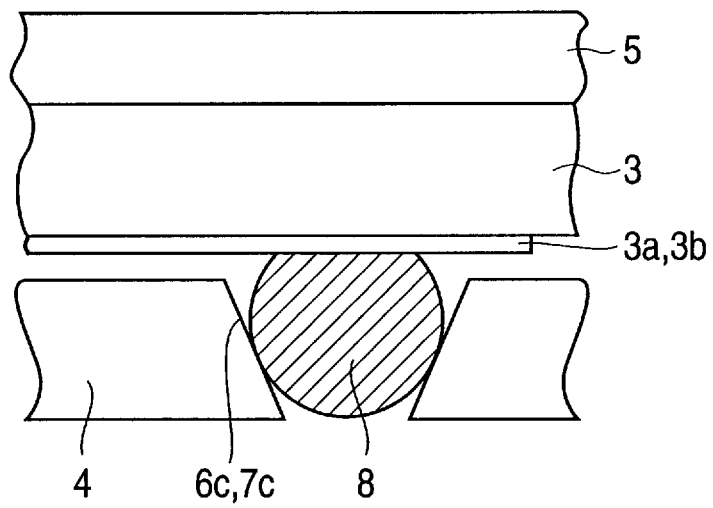
FIG. 9 is a cross-sectional view showing an insertion process of a conductor as another exemplary embodiment of the manufacturing method for an electronic component of the present invention.

FIG. 9 is an enlarged view of an important part of the manufacturing process of FIGS. 8(A)–(E). Upon heating the whole assembly as in the foregoing, the conductor 8 is softened to seal off the feedthrough holes 6c and 7c, and, at the same time, is melted and fused with the electrodes 3a and 3b to complete the electrical connections therebetween.

Figure 10:
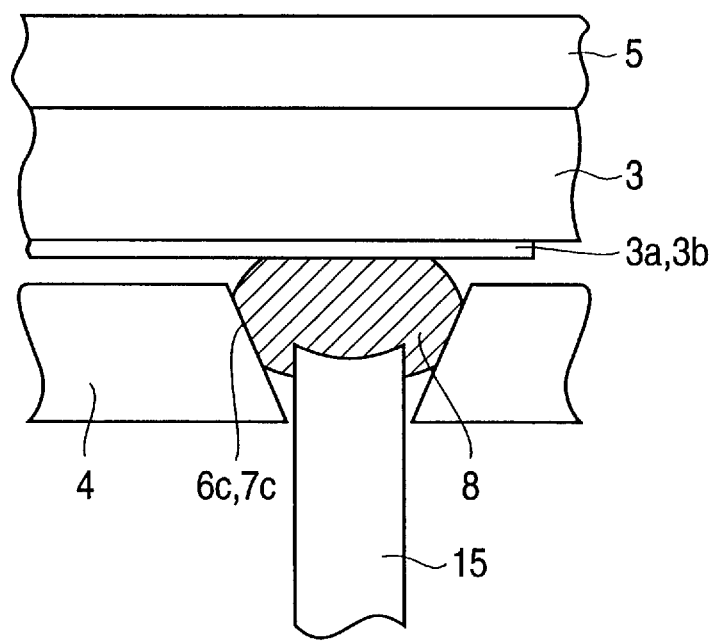
FIG. 10 is a cross-sectional view showing an insertion process of a conductor of yet another exemplary embodiment of the manufacturing method for an electronic component of the present invention.

It is also possible, as shown in FIG. 10, to insert an ultrasonic joining jig 15 into each of the feedthrough holes 6c and 7c from the smaller diameter side thereof, and soften the conductor 8 by applying ultrasonic vibrations to assure the sealing of the feedthrough holes 6c and 7c, and also the connections with the electrodes 3a and 3b.

EXAMPLE 2E

Figure 11:
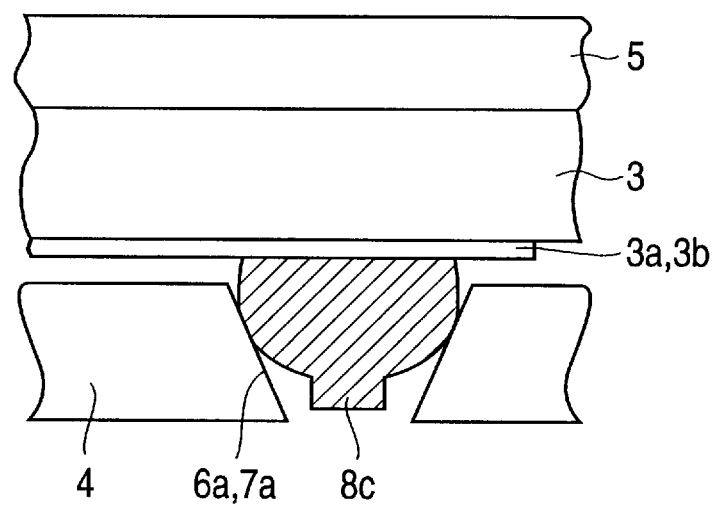
FIG. 11 is a cross-sectional view showing an insertion process of a conductor as still another exemplary embodiment of the manufacturing method for an electronic component of the present invention.

Still another exemplary embodiment of the present invention in connection with the conductor 8 will be explained with the help of FIG. 11. FIG. 11 shows a structure wherein a conductor 8c is bump formed on an electrode 3a or electrode 3b. After the conductor 8c has been inserted into the feedthrough holes 6a and 7a, it is softened by heating or use of an ultrasonic joining jig to seal off the feedthrough holes 6a and 7a in the same way as described in Example 2D, differing therefrom only in that the conductor 8c has already been put together with the electrodes 3a and 3b at the time of bump forming.

EXAMPLE 2F

Next, an exemplary embodiment of the present invention in connection with a process, whereby external electrodes and end surface electrodes are formed, will be explained.

With the manufacturing process as illustrated in FIGS. 4(A)–(C) or FIGS. 8(A)–(E), a plurality of identical electronic components are first fabricated on a wafer at a time so that all the electronic components are arranged orderly on the wafer surface lengthwise as well as breadthwise (9 rows by 15 lines, all together 135 pieces, for example), and then the wafer is broken up into individual pieces of the electronic component.

FIGS. 12(A)–(D) show cross-sectional views of important portions of a recessed place 4a of No. 1 electronic component and a recessed place 4b of No. 2 electronic component. The foregoing No. 1 and No. 2 electronic components are the two neighboring electronic components among many formed on a wafer in an orderly manner as explained above. A concaved area is created between the foregoing two neighboring electronic components at the place, where the two neighboring electronic components are separated by cutting and also where the would-be recessed place 4a of No. 1 electronic component and the would-be recessed place 4b of No. 2 electronic component meet each other. The concaved area is formed by sand blasting at the same time when the feedthrough holes 6 and 7 are formed.

Figure 12A:
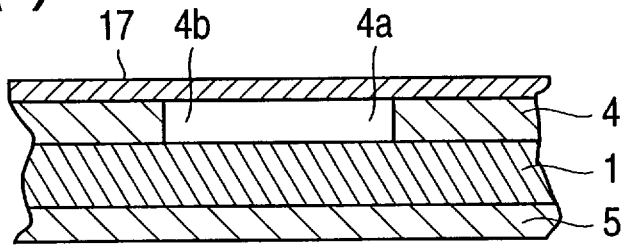
FIG. 12 is a series of cross-sectional views showing fabrication of an external electrode as an exemplary embodiment of the manufacturing method for an electronic component of the present invention.
Figure 12A:

As shown in FIG. 12(A), an electrode film 17 is first formed over the surface of a first plate 4 by applying an electro-conductive material through a continuous printing method. As the electro-conductive material can be used a resin paste containing copper powder, for example.

Figure 12B:
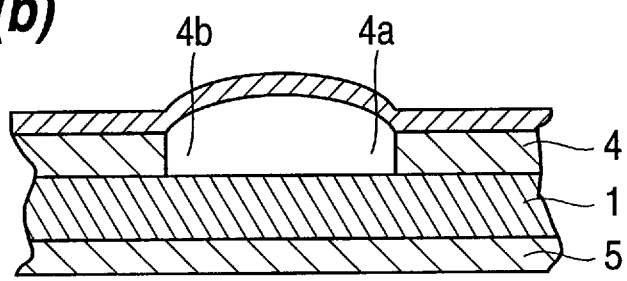
Figure 12B:
Figure 12C:
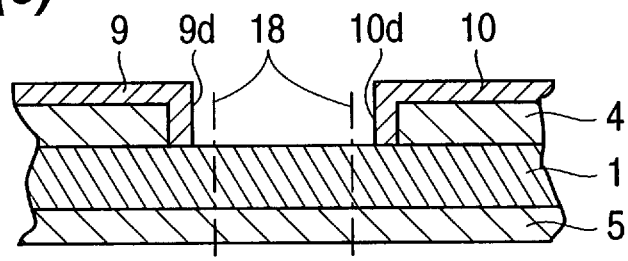
Figure 12C:
Figure 12D:
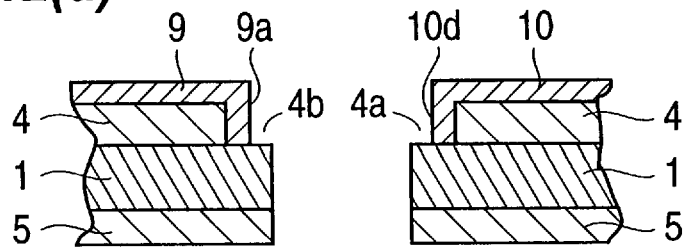

Consequently, the electrode film 17 covers the recessed places 4a and 4b of the first plate 4 with a vacant space formed thereon. Then, the entire body in the state of FIG. 12(A) is placed in a vacuum chamber. Subsequently, the electrode film 17 covering the recessed places 4a and 4b is expanded, as shown in FIG. 12(B), and finally ruptured. Part of the ruptured electrode film 17 is disposed on the end surfaces of the recessed places 4a and 4b. As a result, as shown in FIG. 12(C), end surface electrodes 9a and 10a are formed on the recessed places 4a and 4b, respectively. Afterwards, each individual electronic component is separated by cutting along the broken lines 18 by means of a method of dicing or the like.

Accordingly, external electrodes 9 and 10 and also end surface electrodes 9a and 10a are formed over the surface of the first plate 4. Besides, a shielding electrode 11 can be formed at the same time according to the foregoing external electrode forming process. In this case, a resin paste is applied by use of a specified mask.

Also, another shielding electrode 12 can be formed at a specified place on the outer surface of the second plate by applying a resin paste containing copper powder.

It is further possible to employ a scribing method instead of the dicing method for separating the electronic components. In this case, a greater number of the electronic components can be produced from a given size of wafer because of thinner cutting lines.

A SAW oscillator has been used as an electronic element with the foregoing Examples 1 to 2F, but a SAW filter or an oscillator such as a quartz oscillator and the like can also be used in place of the SAW oscillator.

In addition, instead of borosilicate glass as used for the framework 1, he first plate 4 and the second plate 5, such electrically insulating materials as glass like soda glass and the like, and crystals like quartz, silicon or the like can also be used. Instead of sand blasting, an ultrasonic processing method can also be used to work on the framework.

All in all, the same effect can be expected from those alternative materials and methods as observed in the foregoing examples.

Of course, it should be understood, that a wide range of changes and modifications can be made to the embodiments described above. It is therefore intended that the foregoing detailed description be regarded as illustrative rather than limiting and that it be understood that it is the following claims, including all equivalents, which are intended to define the scope of this invention.

What is claimed is:

1. A manufacturing method for an electronic component comprising the steps of:

producing a framework by forming an opening through a first opening plane and a second opening plane on opposing sides of a base plate resulting in an opening entirely through the base plate;

fixing a first plate onto said first opening plane of the framework;

mounting an electronic element inside of the opening formed in said framework;

fixing a second plate onto said second opening plane of the framework; and heating the electronic component resulting from the preceding steps, thereby directly joining said framework and first plate, and said framework and second plate, respectively.

2. The manufacturing method for an electronic component according to claim 1, wherein said first and second plates are formed of glass.

3. The manufacturing method for an electronic component according to claim 1, wherein said each respective direct joining between said framework and first plate, and between said framework and second plate is performed by applying pressure to said assembly while heating.

4. The manufacturing method for an electronic component according to claim 1, wherein said each respective direct joining between said framework and first plate, and between said framework and second plate is performed by first pressing and then heating the whole assembly.

5. A manufacturing method for an electronic component comprising the steps of:

producing a framework having a first opening plane and a second opening plane;

fixing a first plate onto said first opening plane of the framework, said first plate having feedthrough holes;

mounting an electronic element inside of said framework, said electronic element having electrodes;

placing conductors inside said feedthrough holes, hermetically sealing said feedthrough holes, such that said electrodes are connected to said conductors;

fixing a second plate onto said second opening plane of the framework; and heating the electronic component resulting from the preceding steps, thereby directly joining said framework and said first plate, and said framework and said second plate, respectively.

6. The manufacturing method for an electronic component according to claim 5, wherein diameters of said feedthrough holes are larger at a side of the first plate facing said electronic element than a diameter at an opposite side of the first plate.

7. The manufacturing method for an electronic component according to claim 5, wherein said each respective direct joining between said framework and first plate, and between said framework and second plate is performed by heating the resulting electronic component while applying a pressing force.

8. A manufacturing method for an electronic component comprising the steps of:

producing a framework having a first opening plane and a second opening plane;

fixing a first plate onto said first opening plane of the framework, said first plate having feedthrough holes;

mounting an electronic element inside of said framework, said electronic element having electrodes;

placing conductors inside said feedthrough holes, and hermetically sealing said feedthrough holes such that said electrodes are connected to said conductors;

fixing a second plate onto said second opening plane of the framework; and heating the electronic component resulting from the preceding steps, thereby directly joining said framework and said first plate, and said framework and said second plate, respectively, wherein the step of mounting said electric element inside of said framework is performed while the inside of the framework is kept at a negative atmospheric pressure.

9. A manufacturing method for an electronic component comprising the steps of:

producing a framework having a first opening plane and a second opening plane;

fixing a first plate onto said first opening plane of the framework, said first plate having feedthrough holes;

mounting an electronic element inside of said framework, said electronic element having electrodes;

placing conductors inside said feedthrough holes, and hermetically sealing said feedthrough holes such that said electrodes are connected to said conductors;

fixing a second plate onto said second opening plane of the framework; and heating the electronic component resulting from the preceding steps, thereby directly joining said framework and said first plate, and said framework and said second plate, respectively, wherein said electrodes are connected to said conductors by placing said conductors in said feedthrough holes and melting said conductors using an ultrasonic joining jig against said conductors, such that the feedthrough holes are hermetically sealed.

10. The manufacturing method for an electronic component according to claim 9, wherein the tip of said ultrasonic joining jig has a concaved shape.

11. A manufacturing method for an electronic component comprising the steps of:

producing a framework having a first opening plane and a second opening plane;

fixing a first plate onto said first opening plane of the framework, said first plate having feedthrough holes;

placing conductors inside of said feedthrough holes;

mounting an electronic element inside of said framework and at the same time hermetically sealing said feedthrough holes so that said conductors are connected to said electrodes of said electronic element;

fixing a second plate onto said second opening plane of the framework; and heating the electronic component resulting from the preceding steps, thereby directly joining said framework and first plate, and said framework and second plate, respectively.

12. The manufacturing method for an electronic component according to claim 11, wherein said each respective direct joining between said framework and first plate, and between said framework and second plate is performed by heating the assembly while at the same time applying pressure to said assembly.

13. The manufacturing method for an electronic component according to claim 11, wherein diameters of said feedthrough holes are larger at a side of the first plate facing said electronic element than a diameter at an opposite side of the first plate.

14. A manufacturing method for an electronic component comprising the steps of:

producing a framework having a first opening plane and a second opening plane;

fixing a first plate onto said first opening plane of the framework, said first plate having feedthrough holes;

placing conductors inside of said feedthrough holes;

mounting an electronic element inside of said framework, and hermetically sealing said feedthrough holes, connecting the conductors to electrodes of said electronic element;

fixing a second plate onto said second opening plane of the framework; and heating the electronic component resulting from the preceding steps, and thereby directly joining said framework and first plate, and said framework and second plate, respectively;

hermetically sealing each feedthrough hole by inserting an ultrasonic joining jig to contact the respective conductor and then melting the conductor, forming a connection between said conductor and respective electrode.

15. A manufacturing method for an electronic component comprising the steps of:

producing a container shell by mounting a framework on a first plate having feedthrough holes and concave places;

placing an electronic element inside of said container shell, and sealing the electronic element in the container shell by mounting a second plate on the framework, said electronic element having electrodes;

disposing conductors inside of said feedthrough holes so that electrical connections with said conductors are achieved;

disposing external electrodes on outer surfaces of said container shell such that portions of the external electrodes cover said concave places and form connections with said conductors; and forming electrodes on end surfaces of said concave places by cutting off the portions of said external electrodes covering said concave places, making extensions of said external electrodes.

* * * * *